Dec. 12, 1961 H. A. KOHLER 3,012,451

DIE FOR MAKING AN INTEGRATED CIRCUIT BOARD

Filed Sept. 3, 1958

INVENTOR.
HARRY A. KOHLER

BY

Eugene S. Lovette

United States Patent Office 3,012,451

Patented Dec. 12, 1961

3,012,451

DIE FOR MAKING AN INTEGRATED CIRCUIT BOARD

Harry A. Kohler, 205 Commonwealth Ave., Massapequa, N.Y.

Filed Sept. 3, 1958, Ser. No. 758,858
3 Claims. (Cl. 76—107)

This invention relates to an improved die tool structure and method of making same, which tool is adapted to be used for forming, cutting, and holding in accurate relationship one or more strips of conductive material cut and shaped from conductive foil to take on the form of predetermined circuit patterns and which tool also serves to apply such conductor strips to a suitable insulator base for producing a mechanically integrated circuit board.

The instant invention has more specifically to do with the die cutting and forming tool and method of making same for the purpose of practicing the invention disclosed in copending application Serial No. 709,272, filed January 16, 1958, by Harry A. Kohler, for Mechanically Integrated Circuit Board and a Method of Making Same by Die Forms.

Heretofore two known methods would be generally used in producing stamping or embossing dies for the purpose of producing similar complex circuit patterns as illustrated in the copending application. One method contemplates machining or milling the pattern from a solid body either by using a pantograph machine with a master template or a layout base. The other method contemplates etch relieving or chemically milling the pattern in a solid base wherein the pattern is laid out or masked on the surface with a suitable acid resist material. The machining method is necessarily expensive and tedious. It is time consuming to rough out and finish a complex circuit pattern and, in addition, it involves a great risk of cracking delicate sections of the pattern during heat treatment of the die. In addition, alterations to accommodate pattern changes cannot be performed on dies of this nature; hence its use is limited to mass production applications. The etch relief die is limited to comparatively shallow pattern relief because of under-etching of the pattern cross-section in the process. Sharp edges are difficult to maintain in this type of die. More than a few grindings of the cutting edges of the die will eliminate the pattern relief of same; hence, this type of die is generally restricted to embossing applications.

It is the principal object of this invention to provide an improved die forming and cutting tool and method of fabricating same, wherein said die is adapted to produce desired circuit elements of a mechanically integrated circuit from sheets of conductive material and which die is not confined in use and thus may be employed for short runs as well as mass production applications and which can be easily modified when desired to effect pattern changes in the circuit.

It is another object of the invention to provide an improved die and method of fabricating same wherein the die may be made for the most part from standardized components which can be mass produced and stored until ready for assembly for a particular die and wherein the assemblage of the die is relatively simple in nature and the entire assembly may be permanently fused by introducing same in an atmosphere controlled furnace and securely brazed or fused together.

It is a further object of the invention to provide a die and method of making same which permits the manufacture of a jig or template concurrently therewith, which template may be used for coordinating the alignment of pilot holes and terminal locations between and among the several tools used in fabricating the aforementioned die and in addition during fabrication of an integrated circuit board.

Further objects and advantages will become apparent from the following description taken in conjunction with the figures, in which.

Figures 1, 2, 3, 4, 5, 6, 7, 8, 9, 10:
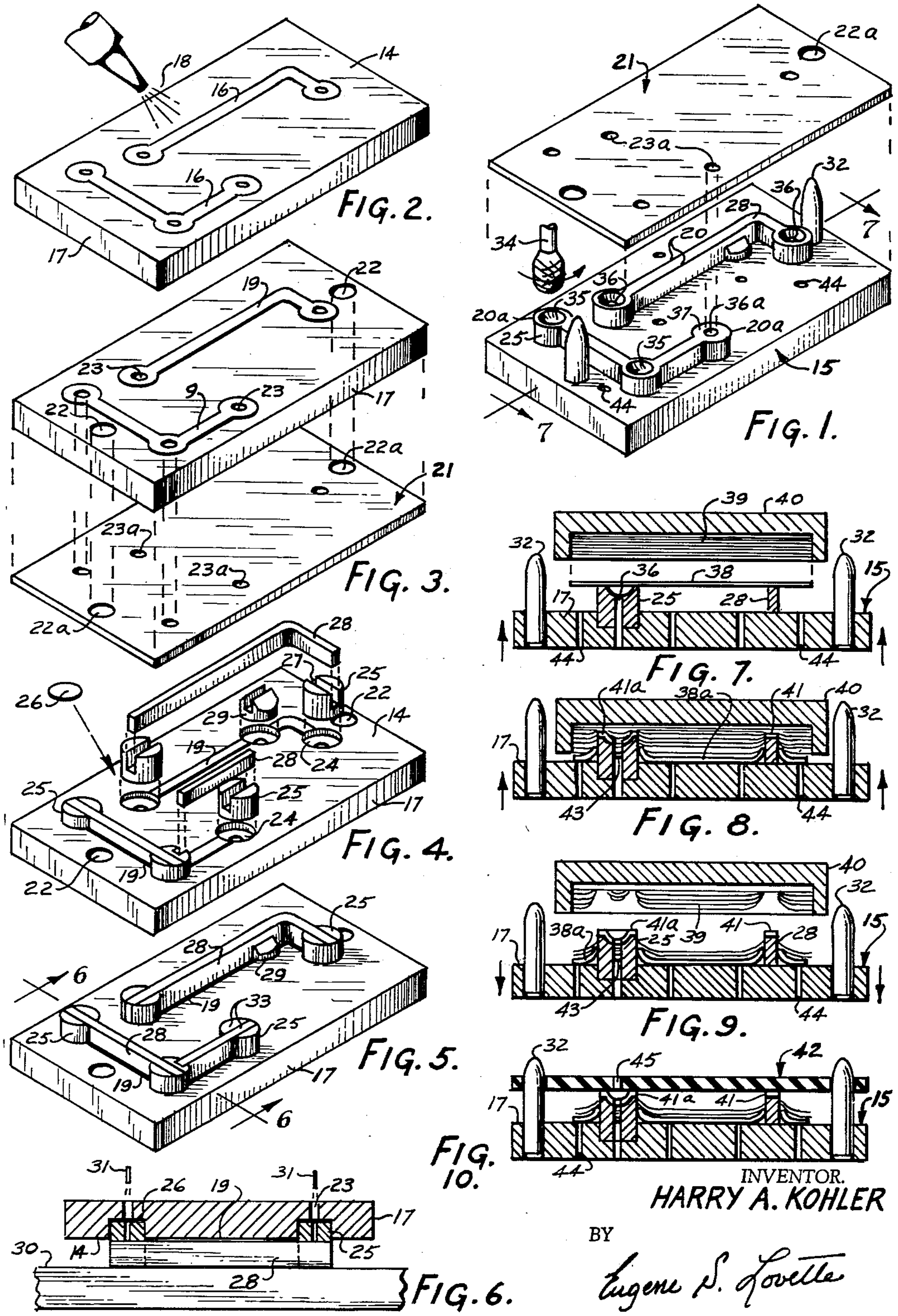
FIG. 1 is a perspective view of the die tool made in accordance with the invention and also shows in correlated relationship a perspective view of a template also made in accordance with the practice of the invention.
FIG. 2 is a perspective view of the die base at an early stage of making same.
FIG. 3 is a perspective view of the die base at a later point in manufacturing same and also shows in exploded and perspective view the template made concurrently therewith.
FIG. 4 shows an exploded perspective view of the elements of the die tool prior to assemblage thereof.
FIG. 5 is a perspective view showing the assemblage of the die as contemplated in FIG. 4.
FIG. 6 is a fragmentary side elevation in section showing the die inverted on a member in preparation for a brazing operation, the section through the die is taken along line 6—6 of FIG. 5.
FIG. 7 is a sectional view in elevation depicting the die in a press and thus illustrating its use in forming an integrated circuit board, wherein the section through the die is taken along line 7—7 of FIG. 1.

FIG. 8 shows a subsequent step of press operation in forming and making the integrated circuit board wherein the die engages the upper platen; and FIG. 9 shows a subsequent step wherein the die has been withdrawn from the upper platen, which platen is to be replaced by an insulator board to be engaged by the die for the purpose of attaching circuit elements to the insulator board which elements have been shaped and formed by the die and are still carried thereon, but as shown in FIG. 10 are now pressed to the circuit board.

Reference is now made to the figures. FIG. 1 illustrates a forming and cutting die 15 made in accordance with the invention. When used for its designed purpose, die 15 will form and shear the circuit elements of an integrated circuit board. The circuit element pattern encompassed by die 15 in the embodiment illustrated in the figures is deliberately simplified in form, and the various elements shown in the several figures are somewhat out of proportion for the purpose of clarity and illustration.

FIG. 2 shows the pattern layout 16 on the upper surface 14 of die base 17, which base is preferably made of a non-deforming tool steel. The shape and contour, that is to say, the plan view of the pattern layout 16, is predetermined and conforms to the desired circuit elements to be shaped by the die forming and cutting members 25, 28. Pattern layout 16 actually consists of masking strips of standard pressure-sensitive adhesive material preformed to desired shape and where desirable include enlarged circular ends for reasons that will become evident hereinafter. Strips 16 may be applied to die base 17 in the design room in accordance to the circuit elements required to be produced. A photograph may be made of same for record purposes. On the other hand, strips 16 may be applied to base 17 according to a master layout print.

The upper face of base 17 is then sprayed as depicted in FIG. 2 with stop-off material 18 such as wax. Stop-off material 18 will cover the exposed portions of base 17 except for the portions thereof covered by strips 16, after which strips 16 are removed so as to leave the exposed surface portions of die base 17 corresponding to the shape of strips 16. The exposed pattern is cleaned and plated with an appropriate thickness of copper 19 or other material necessary for the subsequent brazing operation. Thereafter, stop-off material 18 is removed from die base 17 thus leaving the copper pattern 19 on base 17 as shown in FIG. 3. It will be understood that the aforesaid result may be accomplished by other known methods, such as the use of a silk screening process. A silk screen mask, not shown herein, in accordance with the desired circuit pattern is applied to die base 17. It will be understood that the silk screen will mask that portion of die base 17 that is to be covered by copper strips 19. The remaining portions of top surface of base 17 is then sprayed with stop-off material 18. Upon removal of the silk screen mask, die base 17 may be plated with copper strips 19, as noted hereinbefore; the stop-off material 18 is then removed.

A template 21 of suitable material and die base 17 are then concurrently submitted to a drilling process in which suitably located alignment holes 22 and terminal pilot holes 23 are drilled, note FIG. 3. Certain ones of holes 22, 23 are drilled through die base 17 and through template 21 in accordance with the intended purposes of the holes as will become evident hereinafter. Accordingly, template 21 will have a correlated set of holes *22a*, *23a*. Holes *22a*, *23a* in template 21 subsequently may be enlarged and permanently hardened bushings may be press-fitted therein for producing a more permanent type of template. It will be understood that if other holes, recesses, counterbores or the like are needed in these bodies for subsequent steps of the process, they too may be drilled at this time.

FIG. 4 illustrates die base 17 with its various elements in preparation for assembly. Terminal pilot holes 23 are counterbored at 24 to a suitable depth to receive slotted terminal components 25. After counterboring holes 23, copper inserts 26 may be, if desired, placed into counterbores 24. Inserts 26 are the same thickness as the deposit of copper plating strips 19. Terminal components 25 are inserted in the respective counterbores 24 with their slots 27 suitably oriented. Strip-like die forming and cutting members 28 which were preformed by suitable means are inserted for support in respective slotted components 25 and 29. The ends of members 28 terminate at terminal components 25. If additional mechanical support is desired for any one of the die members 28, particularly a long member, provisions may be made to support same by intermediate slotted support components 29. Whereas, the upper faces of members 28 and terminal components 25 are coplanar at 33, the upper ends of supports 29 are preferably tapered and terminated below the surfaces 33 of the forming and cutting edges 20 of components and members 25 and 28 upon assemblage of the elements 25, 28, 29 to base 17 as seen in FIG. 5. Where auxiliary support members 29 are desired, die base 17 will be suitably drilled and counterbored as noted hereinbefore with respect to FIGS. 3 and 4 to receive members 29.

As seen in FIG. 6, the assembled die tool 15 is inverted and then supported on a flat heat resistant support plate 30 for copper fusing. Additional copper slugs 31 may be dropped into the open ends of pilot terminal holes 23 to insure complete flow of a copper braze. The assemblage is placed in an atmospheric controlled furnace on support plate 30. The furnace temperature is raised slowly to the flow point of copper, wherein all joints will fuse by capillary action of the molten copper. After cooling and withdrawal from the furnace, the fused assembly is ready for further processing.

Temporary alignment pins 32 as seen in FIG. 1 are inserted in holes 22 and then template 21 is mounted over die 15. Using the pilot holes *23a* in template 21, the top surfaces 33 of terminal components are spotted with pilot holes after which template 21 and alignment pins 32 are removed. A suitably shaped rotating forming tool 34 guided by the last-mentioned pilot holes is employed to produce the concave cavities 35 in the top surfaces of terminal components 25.

When it is desired to provide a pierced terminal embossing in a circuit element of the integrated circuit board as shown at 36 in FIGS. 1, 7, a hole of suitable size is drilled into the correlated terminal component 25 at 36 and through such component so as to communicate with the aligned pilot hole already in die base 17. If a flat unembossed terminal is desired in a circuit element of the integrated circuit board, the concave cavity is not cut in the correlated terminal component 25 as shown at 37 in FIG. 1. Piercing of the flat circuit terminal is accomplished by drilling hole *36a* in die terminal component 37.

Die 15 is now ready for heat treatment wherein, die 15 is hardened and tempered to required hardness in accordance with the tool steel used. As is understood in the art, several heat-treating methods may be satisfactorily applied in accordance with available facilities and the type of tool steel used for the die members. Non-deforming air-hardening steels are preferable and may be hardened, without quenching, in a controlled atmosphere furnace, thus minimizing distortion. Localized hardening of the cutting edges may also be applied by known flame hardening and induction hardening techniques. Other methods, depending on the steel used, are to case harden the cutting edges by carburizing or by the nitriding process. After the heat treatment, the operating face of die 15 and, in particular, the forming and cutting edges 20 of die members 28 including the forming and cutting edges *20a* of terminal components 25 and 37 are suitably surface ground. The cavity seats may be ground with a shaped abrasive grinding tool to sharpen the edges of terminal holes at 36. The edges *20a* and cavities 35 of terminal 25 may be considered an integral part of forming and cutting portions of die members 28. Pins 32 are then inserted in alignment holes 22 whereupon die 15 is now ready for its intended use.

The aforesaid copending application describes and illustrates in detail the use of die tool 15. For an adequate appreciation of its advantages, reference is made to FIGS. 7 through 10 to show the action of die 15 in use. FIG. 7 depicts die tool 15 employed in a forming press. A blank sheet 38 of conductive material is mounted on die members 25 and 28. Die tool 15 represents the lower platen. The underside of conductive sheet 38 resting on tool 15 was previously coated with a thin film of cold tack adhesive. The cold tack adhesive will keep the cut conductor strips and other formed components after conductor 38 is sheared and formed in position on their respective die members 25 and 28. A laminated compressible striking pad 39 consisting of an appropriate quantity of thin sheets of paper or fibrous material suitably spot glued to keep the sheets from spreading is embedded in the upper platen 40. The press is rammed upwardly as shown in FIG. 8. This figure depicts the apparatus at the end of the ramming stroke and shows die tool 15 embedded in striking pad 39. At this point, strips 41 conforming to the shape of die members 25 and 28 assembled to die base 17 are sheared and formed such as with terminal embossments *41a* some pierced and others not, in accordance with the shape of the various cutting and forming members of die 15. FIG. 9 shows the lower platen undergoing its downward stroke upon withdrawal from striking pad 39. The formed conductor strips 41 and *41a* are shown resting on the top of die members 25 and 28 of the downwardly moving ram and as noted in the copending application are ready for transfer to an insulating board 42. As noted in FIGS. 8 through 10, the scrap conductor material *38a* and some of the lamina of pad 39 are wedged between the cutting and forming members 28 and 25, and in particular, it will be noted that slug 43 has been sheared from the center of terminal embossing to form a terminal mounting hole corresponding to drilled hole 36 in the correlated cavity. The slug and scrap conductor and paper material may be dislodged by introducing compressed air through apertures 44 provided in die base 17 which apertures were made in base 17 during the drilling process contemplated in FIG. 3 although not previously shown.

FIG. 10 shows striking pad 39 replaced by insulator board 42 which is now mounted in the upper platen. Lower platen is again rammed upwardly wherein the formed and cut strips of conducting material 41 are transferred from die 15 to insulator board 42 which was properly prepared with adhesive.

From the foregoing description, it will be understood that fabrication of die tool 15 is relatively simple. As a matter of fact, the various components constituting die 15 may be standardized, preformed and shelved for use when required. For example, it is contemplated that a large number of rectangular shaped lengths of relatively non-deforming steel may be held in stock for the purpose of cutting and shaping die members 28 whenever required. These may be easily cut and bent to desired shape upon demand. Terminals 25 and auxliary supports 29 may be standardized and mass-produced from round stock of non-deforming steel to desired lengths, slotted as shown and held in stock. Consequently, when a need for a die tool 15 is required it may be quickly assembled.

As a fuurther advantage it will also be appreciated that template 21, which is made in the process of fabricating die tool 15, will also serve as a complementary tool for the purpose of laying out punches and dies for piercing insulator board 42 at 45 as required when making the integrated circuit board in a manner described in the copending application. Template 21 may also be used to spot drill the terminal locations and for drilling the die 15 for terminal piercing holes 36 and 36*a* as indicated in FIG. 1. Furthermore, if circuit design changes are required, the die pattern may be readily altered. The alteration is accomplished by annealing the die, machining away the unwanted circuit elements and/or adding additional or different elements. The elements are added by first drilling the new terminal positions and assembling components 25, 26, 28, and 29 in the same manner as shown in FIG. 4. A strip of suitable brazing foil is placed between die base 17 and new die members 28—this substitutes for the plated strips 19 shown in FIG. 3. The altered assembly is then re-brazed, drilled where necessary, heat treated and re-ground in the same manner as described hereinbefore.

Since many changes could be made in the above construction and many apparently widely different embodiments of this invention could be made without departing from the scope thereof, it is intended that all matter contained herein or shown in the accompanying figures shall be interpreted as illustrative and not in a limiting sense.

What is claimed is:

1. A method for making a forming and cutting die tool for fabricating a mechanically integrated circuit board and which die tool is used primarily for generating sheet-metal like circuit conductors by die cutting same into a pattern of predetermined shape and spaced relationship out of a blank of sheet metal, and which die tool also serves for transferring and applying said conductors to a dielectric supporting board, said method comprising the steps of, describing the selected circuit pattern with masking strips on one face of a die tool base and which circuit pattern is defined by areas of said predetermined shape and spaced relationship, masking the area of said die tool face circumscribing said described pattern with suitable electro-plating stop-off material, removing said masking strips to expose the areas defining said circuit pattern, copper plating said exposed areas wherein said copper plating will serve as a guide for laying out die cutting members on said face and also will serve as a subsequent brazing material, drilling co-operating pilot holes in said die tool base at terminal and support positions, counterboring certain of said holes for receiving slotted terminal and intermediate supporting members, inserting said slotted terminal and intermediate supporting members into the counterbores therefor with the slots thereof oriented to receive the strip like die cutting members, inserting suitably shaped strip like die cutting members into the slots of said terminal and intermediate supporting members wherein said strip members conform to follow the circuit pattern defined by said copper plated pattern on said die face, said die cutting members resting in contact with said copper plating, heating the foregoing assembly in a furnace of non-oxidizing atmosphere and fusing said assemblage together by a furnance temperature causing the copper plating beneath said die cutting members to flow, hardening the die tool assembly, and sharpening top edges of said die cutting members and terminal members to form cutting edges.

2. A method as defined in claim 1 further including, drilling a flat blank template concurrently with drilling of said pilot holes in said die tool base in order to provide a similar pattern of holes in said template.

3. A method as defined in claim 1 further including, forming cavities in certain of said terminal members prior to hardening of said assembly.

References Cited in the file of this patent

UNITED STATES PATENTS

| | | |
|---|---|---|
| 1,527,266 | Nathanson et al. | Feb. 24, 1925 |
| 1,940,294 | Calkins | Dec. 19, 1933 |
| 2,332,360 | Wakefield | Oct. 19, 1943 |
| 2,743,629 | Pellegrino et al. | May 1, 1956 |